United States Patent [19]

Luchaco et al.

[11] Patent Number: 4,833,339
[45] Date of Patent: May 23, 1989

[54] LOAD CONTROL SYSTEM

[75] Inventors: David G. Luchaco, Macungie; Stephen J. Yuhasz, Zionsville; Ian R. Hurst, Allentown; Joel S. Spira, Coopersburg, all of Pa.

[73] Assignee: Lutron Electronics Co., Inc., Coopersburg, Pa.

[21] Appl. No.: 791,318

[22] Filed: Oct. 25, 1985

Related U.S. Application Data

[63] Continuation-in-part of Ser. No. 541,368, Oct. 13, 1983, Pat. No. 4,563,592.

[51] Int. Cl.$^4$ .............................. H01H 47/00
[52] U.S. Cl. ..................... 307/115; 307/132 E; 307/140; 307/66; 361/160; 323/905; 315/291; 315/DIG. 4
[58] Field of Search ................. 307/112–116, 307/132 E, 140, 64, 66; 315/291, DIG. 4; 323/905; 361/160

[56] References Cited

U.S. PATENT DOCUMENTS

| Re. 26,119 | 12/1966 | Slater | 323/905 X |
|---|---|---|---|
| 2,892,132 | 6/1959 | Mallory . | |
| 3,026,448 | 3/1962 | Brown | 315/135 |
| 3,300,711 | 1/1967 | Duncan | 323/905 X |
| 3,430,101 | 2/1969 | Biltz | 323/905 X |
| 3,558,902 | 1/1971 | Casey | 307/3 |
| 3,684,919 | 8/1972 | Cramer | 315/DIG. 4 |
| 3,697,821 | 10/1972 | Johnson | 307/115 X |
| 3,746,923 | 7/1973 | Spira et al. | 315/291 |
| 3,794,888 | 2/1974 | Hisano | 307/140 X |
| 3,940,660 | 2/1976 | Edwards | 307/141 X |
| 4,259,619 | 3/1981 | Wall | 307/115 |
| 4,270,058 | 5/1981 | Schornack | 307/140 |
| 4,274,054 | 6/1981 | Goldstein | 315/360 |
| 4,334,171 | 6/1982 | Parman et al. | 323/905 X |
| 4,367,510 | 1/1983 | Wanatabe | 307/114 |
| 4,410,838 | 10/1983 | Hirschfeld et al. | 307/141.4 X |
| 4,410,839 | 10/1983 | Doskin | 307/141.4 |
| 4,525,634 | 6/1985 | Southard | 307/115 |
| 4,563,592 | 1/1986 | Yuhasz et al. | 307/140 X |
| 4,591,731 | 5/1986 | Garcia | 361/160 X |
| 4,636,652 | 1/1987 | Raes | 307/140 X |
| 4,689,547 | 8/1987 | Rowen et al. | 323/905 X |

FOREIGN PATENT DOCUMENTS

| 2148629 | 5/1985 | United Kingdom . |
| 2154322 | 9/1985 | United Kingdom . |

OTHER PUBLICATIONS

"Sierra Low Voltage Remote Control System Manual" Pass & Seymour, 1984.
Siemens AG, Design Examples of Semiconductor Circuits, 1978–79, pp. 134–138, pertaining to the S566 Dimmer.
Aromat, Corp., "Compact Hybrid Relay with Both Advantages of Relay and Semiconductor, Relays for Advanced Technology", PEC-85-9300A Mar. 5YTo, 1985.
Touch-Plate Electro Systems, Inc., "Components of Touch Plate Systems", TP-701, (O.C.).
Electro Controls Inc., "Lite Touch Lighting Control", Copyright 1981.
EDC Enercon Data Corporation, "Remote Control and Signaling System RCSS", Product Information Guide, Jun. 1983, pp. 2–12.
Siemens Corporation, "Electronic Light Dimmer Electronic Light Switch", Issued by Components Group, pp. 1–10.

*Primary Examiner*—Derek S. Jennings
*Attorney, Agent, or Firm*—Ostrolenk, Faber, Gerb & Soffen

[57] ABSTRACT

A load control switching system includes a switching element adapted to be coupled between a power source and a load. The switch element is operable in an ON state wherein it supplies power from the source to the load and an OFF state wherein it cuts off power from the source to the load. A control circuit controls operation of the switching element in response to the actuation of one or more short-throw, light-force switches which are each movable between a normally open and a momentarily closed position. The control circuit alternates the state of the switching element each time the short-throw, light-force switch is momentarily closed.

57 Claims, 6 Drawing Sheets

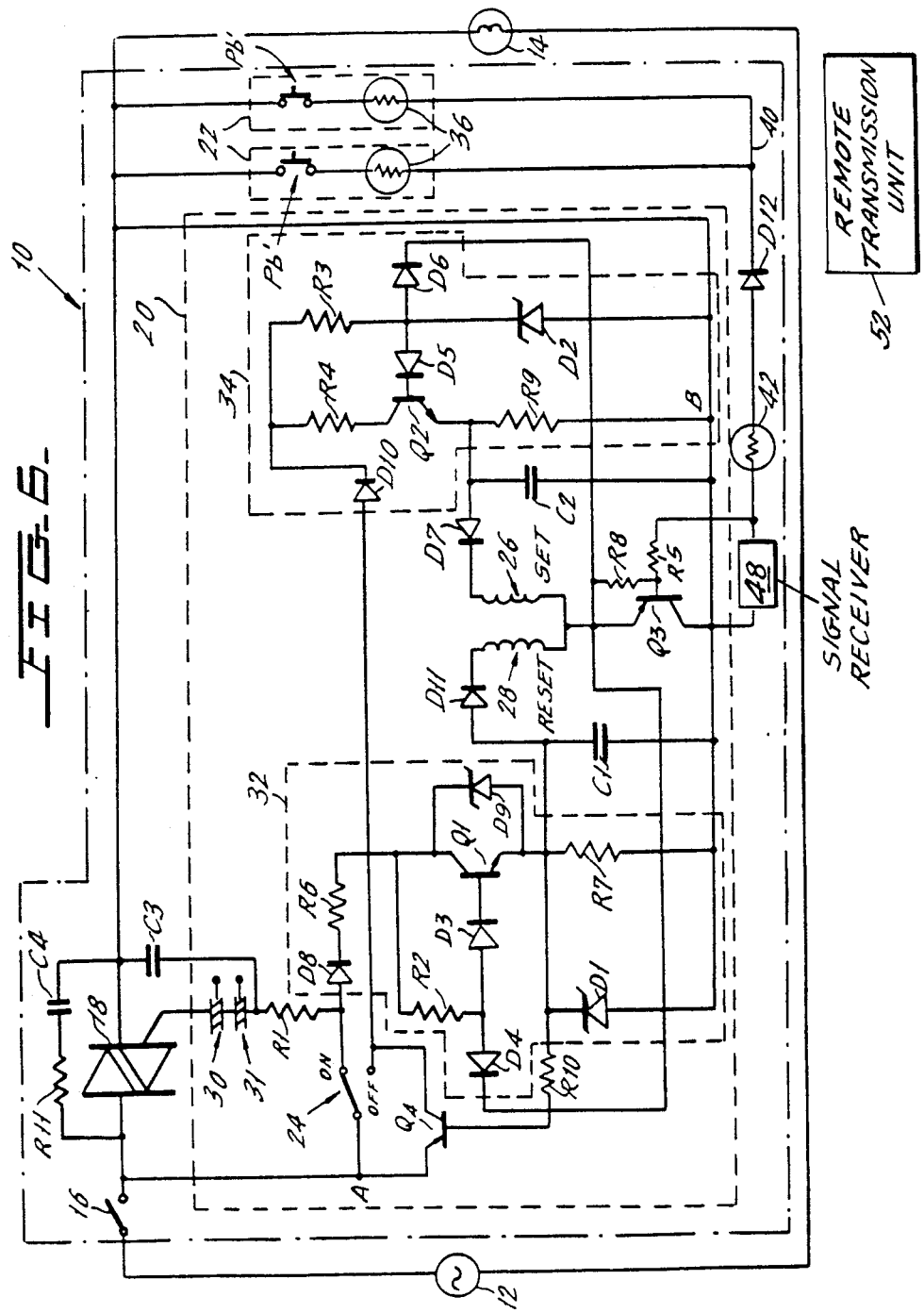

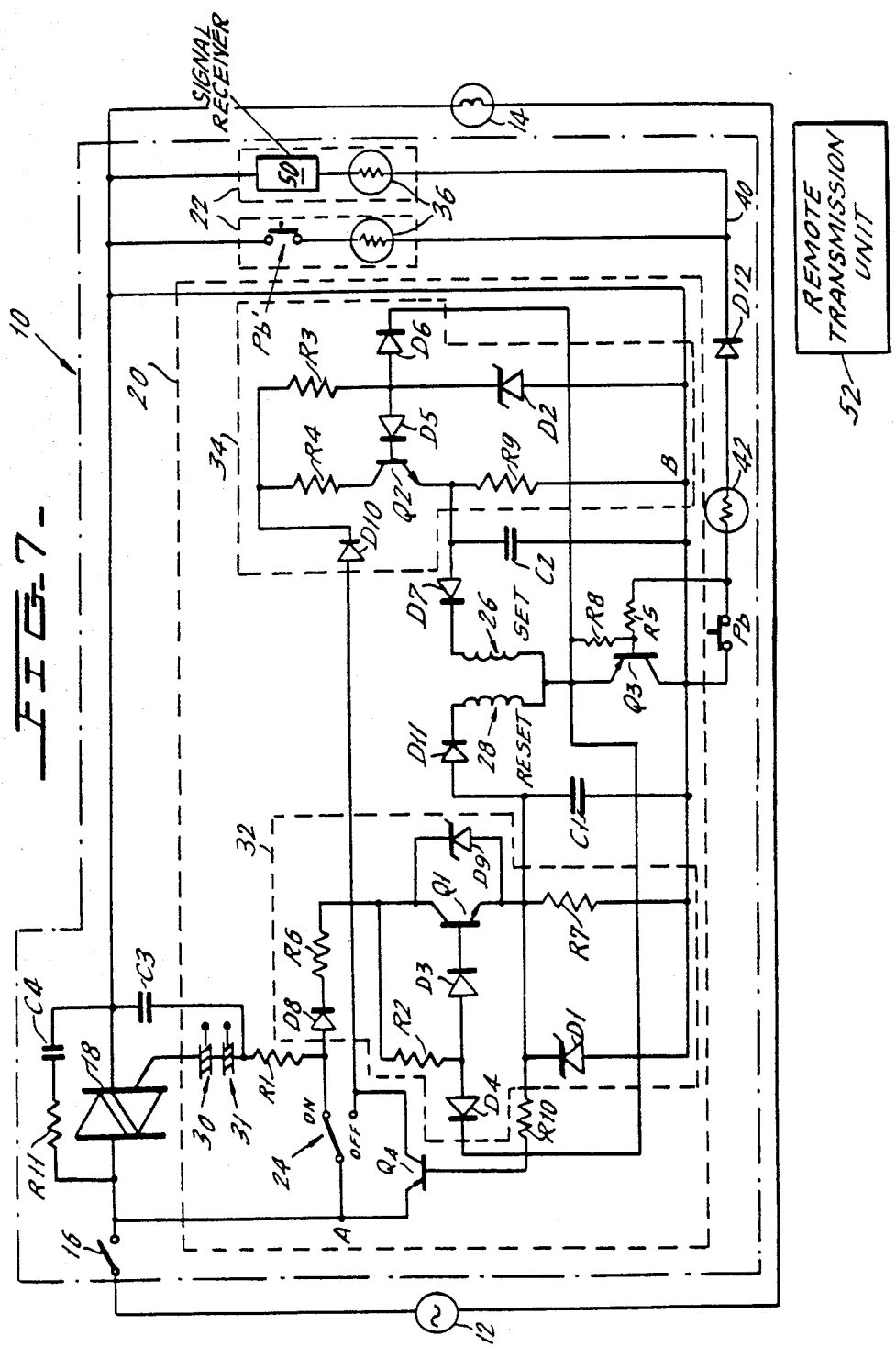

LOAD CONTROL SYSTEM

RELATED APPLICATIONS

This is a continuation-in-part of U.S. application Ser. No. 541,368 filed Oct. 13, 1983, now U.S. Pat. No. 4,563,592, the disclosure of which is incorporated herein by reference.

BACKGROUND OF THE INVENTION

The present invention relates to a single or multi-location load control system including a main control unit and, if desired, one or more remote switching units. The main control unit turns power on or off to one or more loads in response to the receipt of a control signal generated by a human actuable switch or appropriate automatic circuitry (e.g. a timing circuit). The main control unit is preferably located in a single housing adapted to fit in a standard wall box.

One or more remote switching units are located at positions remote from the main control unit. These positions may be in the same room as the main control unit or in different rooms. The remote switching units send a control signal to the main control unit which responds to this signal by either applying power to or removing power from the loads being controlled.

Multi-location control systems of the foregoing type are generally known. The most popular of these systems are standard single pole single throw single location and three way wall switches. More sophisticated systems wherein a plurality of remote switches send control signals to a main control unit which controls power to a load are also known.

BRIEF DESCRIPTION OF THE INVENTION

Each of the prior art systems exhibit important disadvantages. The present invention overcomes the disadvantages of the prior art systems in that it can be mounted in standard house wall boxes, can retrofit any existing three-way or four-way wiring, does not require a neutral connection and has a universal load capability.

In the presently preferred embodiment of the invention, a bidirectionally conductive electronic switching device (preferably a triac) is located in series between a power supply and a load and controls the application of power to the load. A latching control circuit, which may be either an electronic, mechanical or magnetic circuit, controls the operation of the triac and thereby application of power to the load. The control circuit alternatively turns the triac on and off (and thereby applies power to or removes power from the load) in response to a control signal applied thereto. In order to ensure that power is supplied to the control circuit when the triac is on, the control circuit fires the triac shortly after each zero crossing of the source AC wave form with the result that the portion of the AC wave form preceding the instant at which the triac is fired can be used to power the control circuit.

In the preferred embodiment, the power requirements of the control circuit are such that the triac can be fired after a time period corresponding to no more than approximately 5% of each half cycle of the wave form. As will be explained in greater detail below, this can be achieved as a result of the characteristics of the reset capacitor charging circuits of the presently preferred embodiment. By ensuring that the triac can be fired shortly after each zero crossing of the AC wave form, the present invention assures that a substantially sinusoidal wave form is applied to the load and thereby permits the control circuit of the present invention to be utilized with resistive, capacitive and/or inductive loads.

The control circuit has a bistable operation and preferably switches between an ON and OFF position each time a control signal is applied thereto. Whenever the control circuit is in the ON position it will enable the triac shortly after each zero crossing of the source AC wave form and thereby apply power to the load. Whenever the control circuit is in the OFF position it will disable the triac thereby removing power from the load.

The control signal is preferably generated by a human actuable switch. If desired, the control signal can be generated by a timer circuit or any other control apparatus.

The heart of the control circuit is a bistable latch which switches between the ON and OFF conditions each time the control signal is generated. The position of the latch controls the condition of the control circuit.

In the presently preferred embodiment, the latch is a magnetic latching relay including set and reset coils and a contact which moves between an ON and an OFF position every time a predetermined level of current flows through the set and reset coils, respectively. The contact is magnetically latched into the ON or OFF position by respective permanent magnets whenever there is no current flow through the set and reset coils. Set and reset capacitors are associated with the set and reset coils. Set and reset capacitor charging circuits are provided for charging the set and reset capacitors, respectively, when the contact of the relay is in the OFF and ON positions, respectively. The charging circuit preferably includes a current regulator which enables the use of low value charging resistors which ensure that the capacitors are charged quickly. The charged capacitor will discharge through its associated coil in response to the application of a control signal to the control circuit thereby causing the position of the latch (and thereby the operation of the triac) to change. The charging circuits are disabled as long as the control signal is applied to the control circuit to ensure that current does not inadvertently flow through the wrong coil while the control signal is generated.

A control signal is preferably generated by a manually operable short-throw, light-force switch of the type shown in parent application Ser. No. 541,368. The human actuable switch is preferably located in the same housing as the control circuit, the entire housing being received in a standard wall box. A plurality of remote switches can also be used for the purpose of generating the control signal. Remote switches are also preferably short-throw, light-force switches which are located in respective housings, each housing preferably being substantially identical in appearance to the housing in which the control circuit is located.

If desired, a plurality of load control systems can be provided, each controlling the operation of a different set of loads. Each control system will include its own main control unit wherein the controllably conductive switching device, control circuit and main human actuable switch is provided. In order to permit two or more of the load control systems to be operated from a single remote location, a plurality of human actuable switches may be located in a single remote housing, each of the human actuable switches being coupled to the control circuit of a respective one of the load control systems and thereby generating the control signal for that system.

While the control signal is preferably generated by a human actuable switch, an automatic timing circuit can be provided for the purpose of generating the control signal. Wireless remote control devices such as infrared, radio frequency, ultra sonic or sonic devices could also be used.

BRIEF DESCRIPTION OF THE DRAWINGS

For the purpose of illustrating the invention, there is shown in the drawing several forms which are presently preferred, it being understood, however, that the invention is not limited to the precise arrangements and instrumentalities shown.

FIG. 6 is a schematic diagram of an alternative embodiment in which the push button switch Pb of the embodiment of FIG. 1 is replaced by a signal receiver.

FIG. 7 is a circuit diagram of an alternative embodiment of the present invention, in which one of the remote push button switches Pb' is replaced by a signal receiver.

DETAILED DESCRIPTION OF THE INVENTION

Figure 1:
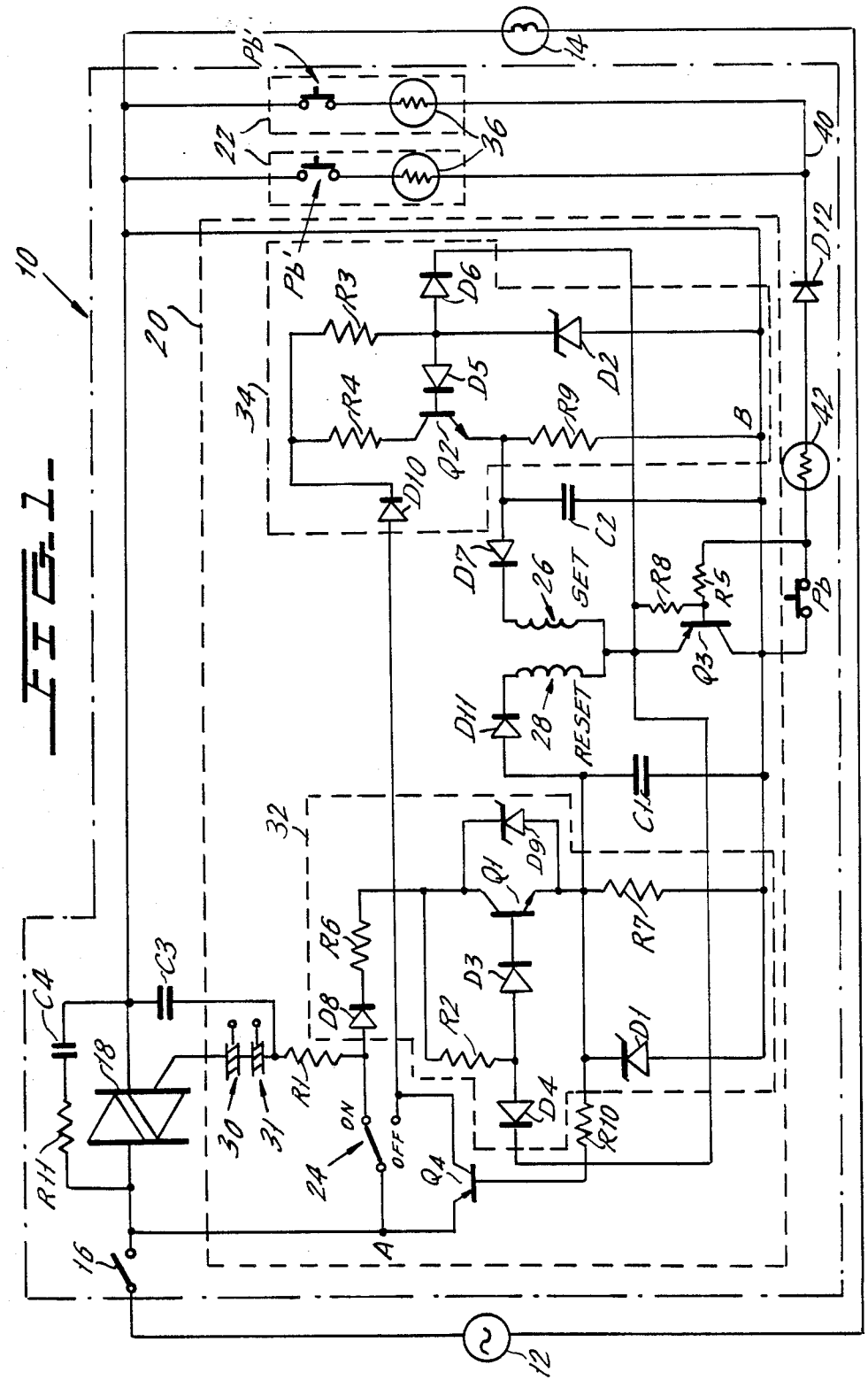
FIG. 1 is a circuit diagram of a load control system in accordance with a first embodiment of the present invention.

Referring now to FIG. 1, there is illustrated a presently preferred embodiment of a load control system constructed in accordance with the principles of the present invention and designated generally as 10. Load control system 10 is connected between a power source 12 and one or more loads 14. While the load 14 is illustrated as being an incandescent lamp, load control system 10 may be used in connection with other loads including capacitive and inductive loads. To control the application of power from source 12 to load 14, control system 10 preferably includes both a manually controlled air gap switch 16 and a bidirectionally conductive electronic switching element 18 which is polarity insensitive (each of its main terminals can be applied to the source 12 or load 14 without affecting the operation of the element). The operation of electronic switching element 18 is controlled by a latching control circuit 20 in response to the receipt of a control signal generated by either the local push button switch Pb or any of the remote switch units 22. Latching control circuit 20 is also polarity insensitive and includes a bi-stable latch which switches between the ON and OFF state each time a local push button switch Pb (preferably located in the same housing as control circuit 20) or a push button switch Pb' (located at one of the remote switch units 22) is depressed. In the OFF state, control circuit 20 removes gate current from electronic switching element 18 (preferably a triac) thereby removing power from load 14. In the ON state, control circuit 20 fires triac 18 shortly after each zero crossing of the AC wave form Vs (FIG. 2) generated by source 12 with the result that a substantially sinusoidal wave form is applied to load 14.

The control circuit 20 and associated push button switch Pb are preferably located in a single housing adapted to be installed in a standard wall box. One such housing is illustrated in FIGS. 11-14 of parent application Ser. No. 541,368. This housing incorporates a short-throw, light-force push button switch which has a highly pleasing tactile feel and needs only be depressed a short distance to move it from its normally open to its momentarily closed position. While the present invention is not limited to the use of such a switch (other mechanical, touch plate, beam break and remote control switches may be used), the use of a short-throw, light force switch is preferred. Such a switch may be used with the present invention because the push button switches Pb, Pb' are subject to low magnitude control voltages and not full line voltages and load currents In the parent application Ser. No. 541,368, only the push button switch is located in the remote housing. When the structure of FIGS. 11-14 of the foregoing application is used in connection with control circuit 20 of the present invention, the control circuit 20, as well as the triac 18 and air gap switch 16, are all preferably located within the single housing. The air gap switch 16 is manually controlled by the operator of system 10, for example by a toggle switch located in the lower right hand corner of the face plate.

Each of the remote switching units 22 includes a push button switch Pb' in series with a positive temperature coefficient resistor 36 which protects the push button switch Pb' from high currents in the event that the remote switching unit 22 is improperly wired. As with the main control unit, each remote switch unit 22 preferably takes the form illustrated in FIGS. 11-14 of application Ser. No. 541,368. These wall plate units are located at locations remote from control circuit 20 and send a control signal to control circuit 20 whenever one of the push button switches Pb' is depressed. This low voltage control signal causes the latching control circuit 20 to toggle from its present state (e.g. The ON state) to the opposite state (e.g. The OFF state).

Latching control circuit 20 can be either an electronic, electromagnetic, or mechanical bistable latching circuit. In the presently preferred embodiment, an electromagnetic latching circuit is used. The heart of latching control circuit 20 is a latching relay comprising a bi-stable contact 24, a set coil 26 and a reset coil 28. Whenever current is pulsed through set coil 26, contact 24 switches to the ON position. Whenever current is pulsed through the reset coil 28, contact 24 switches to the OFF position. The contact 24 is maintained in the ON and OFF positions by permanent magnets. The position of contact 24 defines the state of operation of the latching control circuit 20 and thereby the mode of operation of triac 18. When contact 24 is in the ON position, control circuit 20 gates triac 18 shortly after zero crossing of each half cycle of the AC wave form Vs of source 12 with the result that a substantially sinusoidal voltage VL (FIG. 2) is applied to load 14. When contact 24 is in the OFF position, gate current is removed from triac 18 and the triac is cut off thereby removing power from load 14.

The operation of control circuit 20, and thereby the operation of triac 18, is varied as a function of the position of relay 24. Relay 24 is toggled from the ON to the OFF position whenever capacitor C1 discharges through the reset coil 28 and toggles from the OFF to the ON position whenever capacitor C2 discharges through set coil 26. The charging of capacitors C1 and C2 is controlled by reset capacitor charging circuit 32 and set capacitor charging circuit 34, respectively. The discharging of capacitors C1, C2 is controlled by transistor Q3 which is turned on by the control signals applied to its base by local push button switch Pb and/or remote control circuits 22. The operation of reset capacitor charging circuit 32 will be described first.

Figure 2:
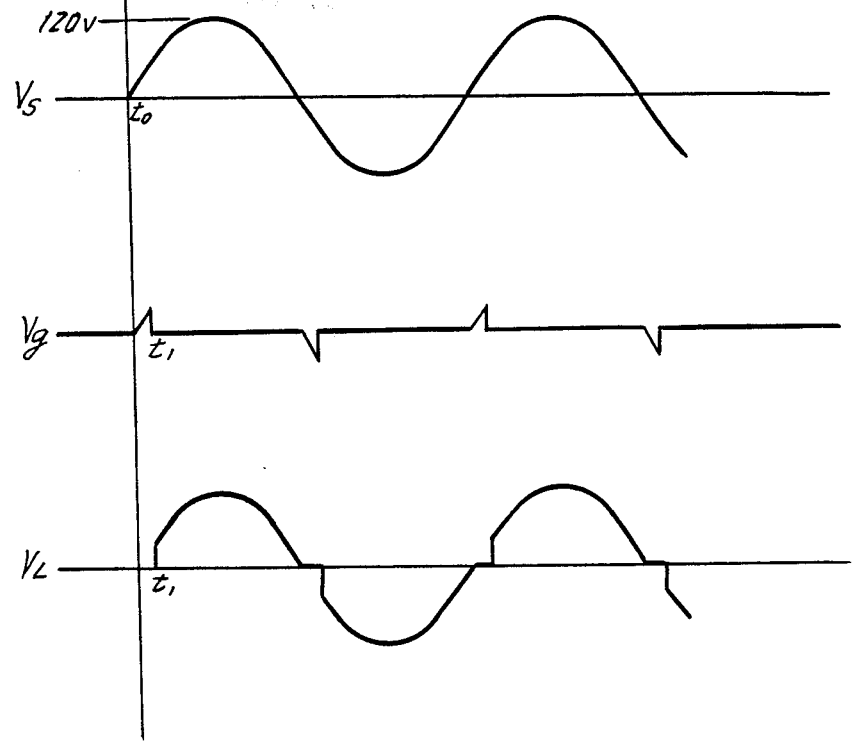
FIG. 2 is a series of wave forms appearing at various locations in the circuit of FIG. 1.

When contact 24 is in the ON position, the voltage at node A will attempt to follow the source voltage Vs. This sine wave is illustrated in FIG. 2. Node A (FIG. 1) is coupled to the gate of triac 18 via contact 24, resistor R1 and silicon bilateral switches 30, 31 (any suitable bilateral break over device can be used). The silicon bilateral switches 30, 31 are designed to break over whenever the magnitude of the voltage across the switch exceeds a predetermined level. The magnitude of the break over voltage is chosen to be sufficiently small to ensure that the voltage applied to load 14 is substantially a sinusoidal voltage while at the same time sufficiently large to provide charging current to capacitor C1. A break over voltage of approximately 15 volts has been found to be suitable. This provides for a off time of approximately one hundred microseconds for the triac 18 yet provides sufficient charging voltage to capacitor C1. As a result of the silicon bilateral switches 30, 31, the voltage Vg between nodes A and B will be a pulsed voltage having a short duration and having a maximum value equal to the level to which capacitor C1 is to be charged. This voltage Vg is illustrated in FIG. 2.

While the maximum value of Vg is set to be equal to the desired maximum voltage level to which capacitor C1 charges, the duration of the Vg pulse is very short (preferably no more than about 5% of one half cycle of the AC wave form Vs). The use of such a short pulse is required to ensure that the load voltage applied by triac 18 will be substantially sinusoidal thereby permitting the system 10 to control capacitive loads. The short off time also serves to minimize incidental radio frequency interference, acoustic noise which may be generated by lamp or transformer loads controlled by the system, and inrush current stresses in the switching device. While such a short pulse duration is desirable in terms of the wave form applied to the load, it provides a very brief time period during which source 12 can supply power to control circuit 20. The design of control circuit 20 makes this possible by requiring a very small amount of power—the power required to maintain sufficient charge on either the capacitor C1 or C2 (depending upon the position of contact 24) at a level sufficient to drive the reset and set coils 28, 26, respectively.

It is desirable to charge the reset capacitor C1 quickly since the operator of system 10 has to wait until capacitor C1 charges before the system can be switched to the OFF state. In order to ensure that capacitor C1 can be charged to the required value in a short period of time (typically 100 to 200 milliseconds), it is necessary that the resistor R6 through which the charging current to capacitor C1 flows have a low value. The use of such a resistor could, however, create problems once capacitor C1 has charged to the desired level. Since capacitor C1 will charge in such a short period of time due to the use of the low value resistor R6, it is quite possible, indeed likely, that the operator of system 10 will still be depressing one of the push button switches Pb, Pb' after the capacitor C1 has charged to its maximum value (determined by Zener diode D1). Since the push button switch Pb, Pb' is still closed, transistor Q3 will be on and current would be permitted to flow directly through resistor R6 into the reset coil 28 thereby inadvertently toggling the control circuit 20 back into the OFF position. To avoid this problem, reset capacitor charging circuit 32 includes the transistor Q1 which acts as a current regulator. Whenever Q3 is off (this will occur whenever push buttons Pb, Pb' are all open) and relay contact 24 is in the ON position, transistor Q1 allows current to flow into capacitor C1. Whenever transistor Q3 is on (this will occur whenever any one of the push button switches Pb, Pb' is closed), transistor Q1 will be cut-off (this is described in greater detail below) and will prevent current from flowing directly to the reset coil 28.

Once the operator of system 10 has released the push button switch Pb, Pb' he had originally depressed and capacitor C1 has charged he can switch control circuit 20 to the OFF mode by depressing any of the push button switches pb, pb'. Whenever any of these switches are closed, base drive (the control signal to control circuit 10) will be available to transistor Q3 and the transistor will turn on. This provides a discharge path for the voltage across capacitor C1 through reset coil 28, diode D11 and transistor Q3. The current pulse passing through reset coil 28 causes the contact 24 to switch to the OFF position. This cuts off triac 18 and once the push button switches Pb, Pb' have been released initiates the charging of capacitor C2.

In the OFF state, the entire supply voltage Vs is available across nodes A and B. As soon as the push button switch Pb, Pb' which initiated the transfer of operation of the latching control circuit 20 from the ON to the OFF mode has been released, transistor Q2 will turn ON and charging current will flow through the diode D10, the resistor R4 and the transistor Q2 to the capacitor C2. If capacitor C2 were permitted to charge to the full source voltage, the current which would pulse through set coil 26 when one of the push buttons switches Pb, Pb' was subsequently depressed could destroy the coil. To avoid this problem, a Zener diode D2 is placed in series with a diode D5 between node B and the base of transistor Q2. As soon as the voltage across capacitor C2 reaches the break over level of Zener diode D2, transistor Q2 will turn OFF and the current flow to capacitor C2 will cease. At this time, capacitor C2 will be free to discharge through diode D7, set coil 26 and transistor Q3 the next time one of the push button switches Pb, Pb' is depressed.

When control circuit 20 is in the OFF mode, triac 18 is OFF and current flow to load 14 is stopped. In this mode, it is extremely important that the leakage current through the control circuit 20 be minimized. The transistor Q2 carefully regulates the flow of current during the OFF mode of control circuit 20 to prevent any significant leakage current. As soon as the push button switch Pb, Pb' which initiated the transfer of operation of the latching control circuit 20 from the ON to the OFF mode has been released transistor Q2 turns ON and supplies current to capacitor C2 via diode D10 and resistor R4. Since this current is being used to charge capacitor C2, there will be some leakage current. Once capacitor C2 has charged to the voltage driven by diode D2, transistor Q2 shuts off but current continues to flow through diode D10, resistor R3 and Zener diode D2. The reverse leakage current through Zener diode D2 is relatively small and is reduced even further by the high value resistor R3 (e.g. 560K ohm). If an attempt was made to reduce leakage current by using a high resistance for resistor R4 and omitting transistor Q2, the charging time of capacitor C2 would be extremely slow (as long as one second). This would be highly undesirable since it would prevent the latching control circuit 20 from being switched back to the ON condition for a period of at least one second. By steering the current in the manner described above, the transistor Q2 avoids this problem.

As discussed above, transistor Q1 ensures that current will not flow from the source 12 to the reset coil 28 while a push button switch Pb, Pb' is depressed (i.e. while the control signal is being applied to control circuit 20). The transistor Q2 which forms part of the set coil charging circuit 34 serves a similar purpose.

Assuming that contact 24 is initially in the ON position and push button switch Pb is depressed, capacitor C1 will discharge through D11, reset coil 28 and transistor Q3 causing contact 24 to switch to the OFF position. If transistor Q2 were permitted to be on at this time (or if the transistor were omitted) charging current could immediately flow from source 12 to capacitor C2. While this would be acceptable, a significant problem could occur once capacitor C2 had accumulated a significant amount of charge. As the voltage across the capacitor C2 increases, so does the voltage available to energize set coil 26. If the push button switch Pb continues to be depressed, transistor Q3 will be on and current will be free to flow through coil 26. If this is permitted to occur it will cause contact 24 to return to the ON position. The process can repeat itself as long as switch Pb is closed and a toggle situation can occur.

To avoid this problem, the base of transistors Q1, Q2 are coupled to the emitter of transistor Q3 via respective diodes D4, D6. Whenever a push button switch Pb, Pb' is depressed, transistor Q3 removes base drive from transistors Q1 and Q2 via D4 and D6 thereby turning the transistors off. This disables charging circuits 32, 34 during the period that any of the push button switches Pb, Pb' are depressed and prevents current from source 12 from passing through coils 26, 28. While this also delays the charging of capacitor C1, C2, this is acceptable since the appropriate capacitor will be charged very quickly when the push button Pb, Pb' is released due to the current regulating characteristics of the transistors Q1, Q2.

Summarizing the foregoing, the interaction of contact 24, low value resistors R6, R4, and transistors Q1–Q3 ensures that the appropriate capacitor C1, C2 is charged only after the push button switch Pb, Pb' which had been closed is returned to the open position (so that the coils 26, 28 cannot accidentally be energized) and that the capacitors C1, C2 are quickly charged when the push button switch Pb, Pb' is released (to ensure that the system can intentionally be switched between the OFF and the ON mode very quickly).

While the above described structure ensures that the capacitors C1, C2 are charged very quickly (e.g. in 100 milliseconds), it is possible that two push button switches Pb, Pb' will be successively closed in such a short time interval that the charge in the appropriate capacitor C1, C2 would not reach a sufficient level to fully energize its associated coil 26, 28. In such a case, it is possible that the contact 24 would be stuck between the ON and OFF positions (i.e. The contact would be in an intermediate position between the ON terminal and the OFF terminal). In this event, charging current will not be available to either capacitor C1 or capacitor C2 with the result that the switching system would be effectively stuck in the OFF condition.

In order to avoid this problem, control circuit 20 includes a bootstrap circuit including transistor Q4, for automatically charging capacitor C2 in the event that relay contact 24 is stuck between the ON and OFF positions. One of the push buttons Pb, Pb' can then be depressed to discharge capacitor C2 through set coil 26 and thereby move relay contact 24 to the ON position.

When contact 24 is stuck between the ON and OFF positions, transistor Q4's base drive current path is from node A into the emitter of transistor Q4, out the base of transistor Q4, through R10 and R7. Note that node A is on the opposite side of triac 18 from the lower end of R7. It is the voltage across triac 18 which provides the drive for transistor Q4's base current. Transistor Q4 can receive base drive whenever Vs>VC1 (the voltage across C1). It is not necessary for VC1=0 for transistor Q4 to turn on. Thus whenever transistor Q4 has base drive and Vs>VC2 (the voltage across C2), transistor Q4 will turn on and charge C2 up to a voltage limited by Zener diode D2 (e.g., 18 V). Resistors R10 and R7 are chosen such that when transistor Q4 is on, C2 will charge fully in less than one second which should be unnoticeable to the user.

The last part of the bootstrap circuit is resistor R9 which functions purely as bleeder resistor. The value of resistor R9 is chosen such that any leakage or noise current through transistor Q4 when it should be off will not charge capacitor C2 but will pass through resistor R9. Resistor R9 is also large enough that it will not significantly discharge capacitor C2 under normal conditions.

In order to protect control circuit 20 from excess voltages due to improper wiring of the control circuit during installation of switching system 10, a positive temperature coefficient resistor 42 is placed in series with Diode D12 in the control line 40. The diode D12 makes it possible to have a single remote switch coupled to a plurality of load control systems, each controlling the operation of different sets of loads, and to have that single remote switch operate as a control switch for each of the control systems. This is described in greater detail in application Ser. No. 541,368 except that in the foregoing application the diodes are external to the control circuits.

A snubber circuit comprising resistor R11 and capacitor C4 are placed in parallel with triac 18 to limit the rate of rise of voltage across the triac so as to protect the same when it is used in connection with inductive loads.

Under normal conditions, the charging voltage to capacitor C1 is the low duty cycle pulsed voltage Vg illustrated in FIG. 2. This voltage is typically no more than 15 volts. In the event that the contact 24 is toggled from the OFF to the ON position at some point other than the voltage zero crossing of the AC source 12, a relatively large voltage could appear between nodes A and B before triac 18 is fired. To protect the transistor Q1 in the event of such a large voltage, a Zener diode D9 is placed parallel with the collector and emitter of transistor Q1.

Figure 3:
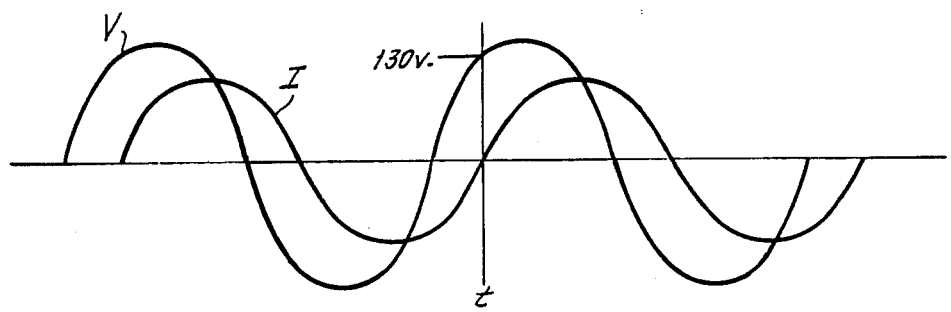
FIG. 3 is a wave diagram illustrating the manner in which the current lags the voltage when the present invention is used in connection with inductive loads.

As noted above, the switching system 10 is designed for inductive as well as resistive loads. When used with an inductive load, the current lags the voltage as shown in FIG. 3. Referring to FIG. 3, the current goes to zero at time t and the triac 18 turns OFF. The triac 18 needs a gate pulse to begin conducting in the opposite direction. The voltage available across the triac 18 depends on how inductive the load is but can easily be as high as 130 V. This would cause the gate to fire instantaneously which would provide no time to charge capacitor C1. To avoid this problem, a capacitor C3 is placed in parallel with the series connection consisting of the silicon bilateral switches 30 and 31 and the gate of triac 18, and delays the instant at which triac 18 turns ON by a short period of time sufficient to allow capacitor C1 to charge but short enough to preserve the desired essentially sinusoidal wave form applied to load 14.

While the capacitor C3 ensures that capacitor C1 will charge even with highly inductive loads, the delayed firing of triac 18 results in voltages across nodes A and B of greater than the 15 volts to which the capacitor C1 is designed to be charged. For this reason, a Zener diode D1 is placed in parallel with capacitor C1 to limit the charge on capacitor C1 to safe levels.

The presently preferred values of the resistors, capacitors and Zener diodes of FIG. 1 is set forth in table 1 below.

TABLE 1

| RESISTOR | VALUE IN OHMS | CAPACITOR | VALUE IN MICRO FARADS | ZENER | VALUE IN VOLTS |
|---|---|---|---|---|---|
| R1 | 150 | C1 | 68 | D1 | 22 |
| R2 | 22k | C2 | 68 | D2 | 18 |
| R3 | 560k | C3 | 0.22 | D9 | 22 |
| R4 | 2.2k | C4 | 0.047 | | |
| R5 | 3.3k | | | | |
| R6 | 47 | | | | |
| R7 | 390k | | | | |
| R8 | 47k | | | | |
| R9 | 390k | | | | |
| R10 | 1.2 M | | | | |
| R11 | 1k | | | | |

All diodes are type 1N4004. Triac 18 is an MAC224-5. Transistor Q1 is an MPS-A13, transistor Q2 is a 2N6517, transistor Q3 is an MPS-A56 and transistor Q4 is an MPS-A92.

The load control system 10 of the foregoing embodiment has several advantages. Because the only power needed for the control circuit 20 is the power required to charge and maintain the charge on the capacitors C1 and C2, the triac 18 can remain on for substantially the full AC wave form. This makes it possible to utilize the control system 10 with capacitive loads. The time required to charge the capacitor C1 and C2 to the required level can be very short due to the use of the low value charging resistors R6 and R4. These resistors can be used due to the operation of the capacitor charging circuits 32, 34 which make it possible to use low charging resistors while at the same time preventing high leakage currents and the possibility that the contact 24 would go into a toggle state while the push button switch Pb is depressed.

Another major advantage of the present invention is the control circuit 20 is powered by the voltage across triac 18 (both in the ON and OFF condition of control circuit 20) alone. As a result, the control circuit need only be connected between the source 12 and the load 14 and does not have to be connected to neutral.

Another significant advantage of the present invention is that it is polarity insensitive; the nodes A and B can be connected to the source 12 and load 14, respectively, or to the load 14 and source 12, respectively.

Figure 5:
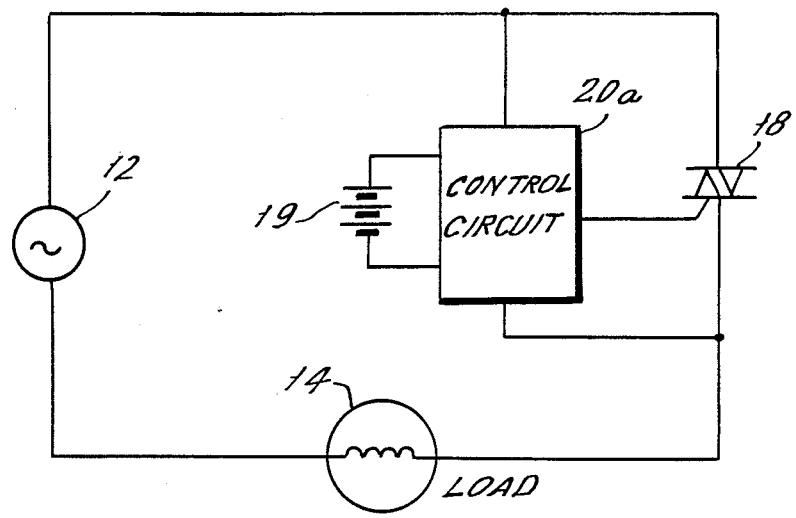
FIG. 5 is a block diagram showing an alternate embodiment which includes an electronic latch associated with a standby energy source.

Another major advantage of the present invention is that it inherently contains a power off memory in which the control circuit 20 remembers whether it was in the ON or the OFF state when power is removed from the control circuit 20. When the power is returned, the control circuit will either enable or disable the triac 18 as determined by the original condition of the control circuit. The power off memory function is achieved as a result of the use of the bistable latch. If an alternate embodiment of a control circuit 20a, incorporating an electronic latch, were used for this purpose (see FIG. 5), a lithium battery 19 or similar power source would be supplied to maintain the latch in its original position before the AC power to control circuit 20a was removed.

Figure 4:
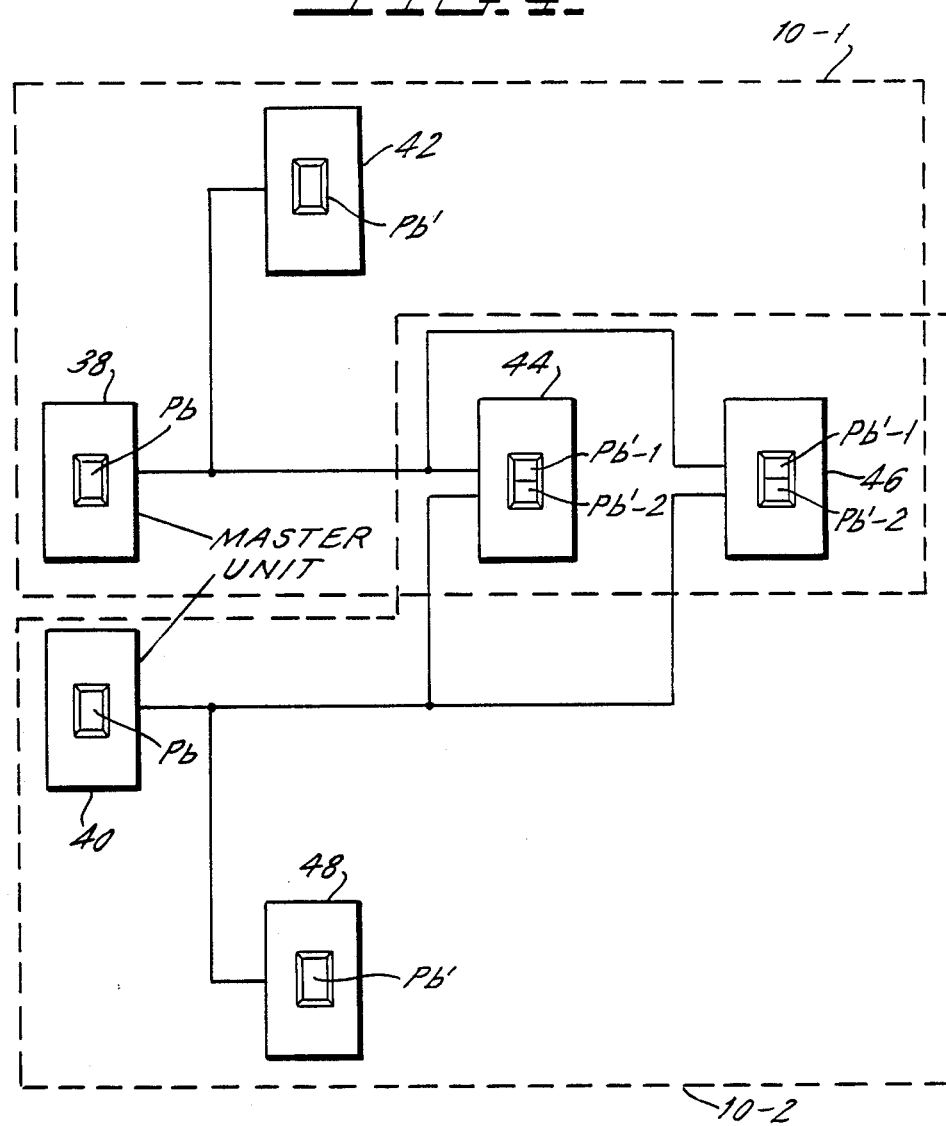
FIG. 4 is a schematic diagram illustrating the manner in which two control systems constructed in accordance with the principle of the present invention can be controlled from a single remote control unit.

FIG. 4 is a schematic diagram illustrating the manner in which two load control systems 10-1, 10-2 constructed in accordance with the present invention can share remote control switches. The first control system 10-1 includes a main housing 38 (which houses a triac 18, a control circuit 20 and the local push button switch Pb) and three remote control switch housings 42, 44 and 46 (the housings 44 and 46 also forming part of the control system 10-2 as described below). The housing 42 is substantially identical in external appearance to housing 38 and houses a single remote switching circuit 22 including the push button switch Pb'. The housings 44, 46 are also substantially identical in appearance to the housing 38 except that they each include a pair of remote control switching circuits 22, each of which includes a respective push button switch Pb'-1, Pb'-2. The combined size and shape of the push button switches Pb'-1 and Pb'-2 are approximately equal to the overall size and shape of the single push button switch Pb' in main housing 38. The push button switch Pb'-1 in each of the housings 44, 46 is coupled to the control circuit 20 of main housing 38 and applies a control signal to control circuit 20 whenever depressed.

The push button switches Pb'-2 of housings 44 and 46 are coupled to the main housing 40 of the load control system 10-2. Like housing 38, the main housing 40 houses the control circuit 20, the triac 18 and the push button Pb of the load control circuit 10-2. Whenever one of the push button switches Pb'-2 is depressed, it applies a control signal to the control circuit 20 located in housing 40. As such, the single housing 44 (as well as the single housing 46), includes a pair of push button switches, one for each of the load control systems 10-1, 10-2 and thereby makes it possible to control two sets of loads from a single remote location.

In the embodiment illustrated, the load control system 10-2 also includes a housing 48 which houses a single remote switching unit 22 including the push button switch Pb'. While each load control system 10-1, 10-2 is shown as having three remote units, two of which are located in the same housing as the remote unit for the other load control system, the invention is not so limited and other combinations can be used.

In the foregoing description of FIG. 4, the control plates at the front of each of the housings 38-46 are referred to as push button switches. In fact, each push button switch is located internally of the housing and the element viewed from the front of the housing is an actuator plate coupled to the push button switch. This is described in more detail in parent application Ser. No. 541,368. As used in the appended claims, the term "actuator plate" refers to the plate labeled Pb, Pb', Pb'-1 and Pb'-2 in FIG. 4.

In the foregoing description, the bidirectionally conductive switching element 18 is shown as a triac. Other bidirectional devices can be used. Additionally, hybrid circuits which effectively operate as a bidirectionally conductive switching means (e.g. a pair of back to back SCR's) can also be used.

In the foregoing description, the control signal is generated by either a local push button switch Pb or a remote push button switch Pb'. One or more of these switches can be replaced by signal receivers which closes a normally open switch in response to the receipt of a remotely generated wireless signal (e.g., an infrared, radio frequency, ultrasonic or sonic signal). One possible embodiment is illustrated in FIG, where the local push button switch PB is replaced by a signal receiver 48. In the embodiment of FIG. 7, one of the remote push button switches Pb' is replaced with a signal receiver 50. In both cases, the signal receiver responds to the receipt of a wireless signal generated by a matching wireless remote unit 52 which generates, for example, infrared, radio frequency, ultrasonic or sonic signals.

The present invention may be embodied in other specified forms without departing from the spirit or essential attributes thereof and, accordingly, reference should be made to the appended claims, rather than to the foregoing specification, as indicating the scope of the invention.

What is claimed is:

1. A load control system, comprising:
   switching means having first and second main terminals and a control terminal; and
   a control circuit coupled to said control terminal and controlling the operation of said switching means in response to control signals applied to said control circuit, said control circuit being coupled directly to said first and second main terminals and deriving all of its power from the voltage which appears across said main terminals of said switching means when said switching means is coupled between a source and a load, said control circuit including a bistable latch operable in an ON and an OFF condition, the condition of said latch determining whether said switching means is operated in an ON or an OFF state, said bistable latch maintaining its present condition when power is removed from said control circuit.

2. The load control system of claim 1, further including:
   a switch for generating said control signals; and
   a housing, said switching means, said control circuit and said switch being located in said housing.

3. The load control system of claim 2, wherein said switch is a human actuable switch.

4. The load control system of claim 1, further including an air gap switch coupled in series with said main terminals of said switching means.

5. The load control system of claim 4, further including:
   a local switch for generating said control signals; and
   a housing; said switching means, said control circuit, said air gap switch and said local switch all being located in said housing.

6. The load control system of claim 5 wherein said local switch is a human actuable switch.

7. The load control system of claim 1, wherein said control circuit alternates the condition of said latch in response to each successive control signal applied to said control circuit.

8. The load control system of claim 1, wherein said bistable latch is an electronic latching circuit.

9. The load control system of claim 1, wherein said bistable latch is a mechanical latch.

10. The load control system of claim 1, wherein said bistable latch is a magnetic latch.

11. The load control system of claim 1, further comprising:
    a local switch for generating said control signals;
    a housing; said control circuit, said switching means, and said local switch being located in said housing; and
    a remote switch unit including a human actuable switch, said human actuable switch being located at a position remote from said housing and generating control signals in response to the actuation thereof, said control signals being supplied to said control circuit.

12. The load control system of claim 1, wherein said bistable latch is a magnetic latching relay having set and reset coils and a contact movable between ON and OFF positions, the position of said contact determining the condition of said latch.

13. The load control system of claim 12, wherein said control circuit further includes:
    set and reset capacitors associated with said set and reset coils, respectively;
    means for charging said set and reset capacitors when said contact is in the OFF and the ON position, respectively; and
    means for discharging said charged capacitor through its associated coil in response to the application of said control signal to said control circuit.

14. The load control system of claim 13, further including means for charging a predetermined one of said capacitors whenever said contact is stuck in a position intermediate said ON and OFF positions.

15. The load control system of claim 13 further including means for disabling said charging means as long as said control signal is applied to said control circuit.

16. The load control system of claim 15, wherein:
    said charging means includes a first current regulator which supplies current to said set capacitor when said contact is in said OFF position and a second current regulator which supplies current to said reset capacitor when said contact is in said ON position; and
    said disabling means disables said current regulators whenever said control signal is applied to said control circuit.

17. A load control system, comprising:
    (A) a main control unit including:

(1) switching means having first and second main terminals and a control terminal;

(2) a control circuit coupled to said control terminal and controlling the operation of said switching means in response to control signals applied to said control circuit, said control circuit being coupled directly to said first and second main terminals and deriving all of its power from the voltage that appears across said main terminals when said switching means is coupled between a source and a load, said control circuit being polarity insensitive and operating properly irrespective of whether the first and second main terminals of said switching means are coupled to said load and said source, respectively, or to said source and said load, respectively;

(3) local means for generating said control signals to be applied to said control circuit; and (4) a housing in which said switching means, said control circuit and said local means are housed;

(B) a remote switching unit for generating said control signals to be applied to said control circuit from a location remote from said main control unit said remote switch unit i including a human actuable switch located in series with a positive temperature coefficient resistor; and (C) signal transmission means for applying said control signals generated by said remote switching unit to said control circuit.

18. The load control system of claim 17, wherein said signal transmission means is a low voltage control wire connecting said remote switching unit to said control circuit.

19. The load control system of claim 17, wherein said signal transmission means is a low power control wire connecting said remote switching unit to said control circuit.

20. The load control system of claim 17, wherein said remote switching unit is located in a housing whose external appearance is substantially identical to the external appearance of said housing of said main control switch.

21. The load control system of claim 17, wherein said local means is a signal receiver located in said housing and wherein said system further includes a wireless remote unit for transmitting signals to said local means and causing said local means to generate said control signals in response thereto.

22. The load control system of claim 17, wherein said local means is electrically connected to a remote receiver, and wherein said system includes a wireless remote unit for transmitting signals to said remote receiver, said remote receiver responding to said transmitted signals by applying signals to said local means which causes said local means to generate said control signals.

23. A load control system comprising:

(A) a first main control unit including a first main control unit housing, a first switching means located in said first main housing, a first control circuit located in said first main housing and controlling the operation of said first switching means in response to first control signals applied to said first control circuit, and first local means located in said first main housing for generating said first control signals and applying them to said first control circuit;

(B) a second main control unit including a second main control unit housing, a second switching means located in said second main housing, a second control circuit located in said second main housing and controlling the operation of said second switching means in response to second control signals applied to said second control circuit, and second local means located in said second main housing for generating said second control signals and applying them to said second control circuit;

(C) a remote switch unit including a remote switch unit housing and first and second human operable switches located in said housing for respectively generating third and fourth control signals in response to the human actuation thereof, said first and second control circuits being controllable by said third and fourth control signals, respectively; and (D) signal transmission means for applying said third control signals generated by said first human operable switch to said first control circuit and for applying said fourth control signals generated by said second human actuable switch to said second control circuit;

wherein the external appearance and configuration of said first and second main control unit housings and said remote switch unit housing are substantially identical.

24. The load control system of claim 23, wherein:

said first and second local means are respective push button switches controlled by first and second actuator plates located on a front face of said first and second main control unit housings, respectively;

said first and second human actuable switches are push button switches which are actuated by third and fourth actuator plates appearing on the front face of said remote switching unit housing; and the combined shape and size of said third fourth actuator plates is substantially the same as the shape and size of each of said first and second actuator plates.

25. A load control system, comprising:

an electronic switching means operable in a conductive and a non-conductive state, said switching means including first and second power leads connectable to a source and load, respectively;

a control circuit for controlling the operation of said switching means whenever power is applied to said control circuit and as a function of control signals applied to said control circuit, said control circuit including memory means for storing the state of said switching means immediately before power is cut off from said control circuit and for returning said switching means to said stored state when power is returned to said control circuit.

26. The load control system of claim 25, wherein said memory means is a bistable latch forming part of said control circuit, said latch having an ON state and an OFF state, said control circuit causing said electronic switching means to operate in said conductive state when said latch is in said ON state and causing said electronic switching means to operate in said nonconductive state when said latch is in said OFF state.

27. The load control system of claim 26, wherein said bistable latch is a mechanical latch.

28. The load control system of claim 25, wherein said bistable latch is a magnetic latch relay having set and reset coils and a contact movable between ON and OFF positions, the position of said contact determining the condition of said latch.

29. The load control system of claim 28, wherein said control circuit further includes:
   set and reset capacitors associated with said set and reset coils, respectively;
   means for charging said set and reset capacitors when said contact is in the ON and the OFF position, respectively; and
   means for discharging said charged capacitor through its associated coil in response to the application of said control signal to said control circuit.

30. The load control system of claim 29, further including means for charging a predetermined one of said capacitors whenever said contact is stuck in a position intermediate said ON and OFF positions.

31. The load control system of claim 27, further including means for disabling said charging means as long as said control signal is applied to said control circuit.

32. The load control system of claim 31, wherein:
   said charging means includes a first current regulator which supplies current to said set capacitor when said contact is in said OFF position and a second current regulator which supplies current to said reset capacitor when said current is in said ON position; and
   said disabling means disables said current regulators whenever said control signals applied to said control circuit.

33. The control system of claim 25, wherein said electronic switching means and said control circuit are all located in a single housing.

34. The load control system of claim 32, further including a local human actuable switch housed in said housing.

35. The load control system of claim 34, further including at least one remote switch, each said remote switch being housed in a respective remote switch housing, each said remote switch generating control signals which are applied to said control circuit.

36. The load control system of claim 35, wherein the external appearance of said main and remote switch housings are substantially identical.

37. The load control system of claim 25, wherein said electronic switching means is bidirectionally conductive and has first and second main terminals and a control terminal and wherein said control circuit derives all of its power from the voltage which appears across said main terminals of said switching means when said switching means is coupled between a source and a load and wherein said control circuit is polarity insensitive and operates properly irrespective of whether the first and second main terminals of said switching means are coupled to said load and said source, respectively, or to said source and load, respectively.

38. A load control system, comprising:
   a bidirectionally conductive electronic switching element having first and second main terminals and a control terminal, said electronic switching element being operable in a conductive and a nonconductive mode as a function of enabling signals applied to said control terminal; and
   a control circuit coupled directly to said control terminal and said first and second main terminals and controlling the operation of said switching means in response to control signals applied to said control circuit, said control circuit being operable in an ON mode and an OFF mode, said control circuit causing said electronic switching element to be nonconductive whenever said control circuit is in said OFF mode and causing said electronic switching element to be conductive for at least 95% but less than 100% of each half cycle of an AC wave form applied across said first and second main terminals whenever said control circuit is in said ON state and said electronic switching element is coupled between an AC source and a load, said control circuit including a bistable latch which is operable in an ON and an OFF state, said bistable latch being a magnetic latching relay having set and reset coils and a contact movable between ON and OFF positions, the position of said contact determining the state of said latch;
   said control circuit deriving all of its power from the voltage that appears across said main terminals when said switching element is coupled between an AC source and a load.

39. The load control system of claim 38, wherein said control circuit is polarity insensitive an operates properly irrespective of whether said first and second main terminals of said switching means are coupled to said load and said source, respectively, or to said source and load, respectively.

40. The load control system of claim 38, herein said control circuit alternates the state of said latch in response to each successive control signal applied to said control circuit.

41. The load control system of claim 38, wherein said control circuit further includes:
   set and reset capacitors associated with said set and reset coils, respectively;
   means for charging said set and reset capacitors when said contact is in the OFF and ON position, respectively; and
   means for discharging said charged capacitor through its associated coil in response to the application of said control signals to said control circuit.

42. The load control system of claim 41, further including means for charging a predetermined one of said capacitors whenever said contact is stuck in a position intermediate said ON and OFF positions.

43. The load control system of claim 41, further including means for disabling said charging means as long as said control signals are applied to said control circuit.

44. The load control system of claim 43, wherein:
   said charging means includes a first current regulator which supplies current to said set capacitor when said contact is in said OFF position and a second current regulator which supplies current to said reset capacitor when said contact is in said ON position; and
   said disabling means disables said current regulators whenever said control signal is applied to said control circuit.

45. The load control system of claim 38, further including an air gap switch coupled in series with said electronic switching element.

46. A load control system, comprising:
   (a) switching means having a control terminal, and having first and second main terminals, each of said main terminals being connectable to either one of a main power source and a load; and
   (b) a control circuit coupled to said control terminal and controlling the operation of said switching means in response to control signals applied to said control circuit, said control circuit being coupled directly to said first and second main terminals of said switching means;

(c) said control circuit deriving all of its power from a voltage which appears across said main terminals of said switching means when said main terminals are connected to said load and to said main power source, and said main power source is supplying power;

(d) said control circuit including an electronic latching circuit operable in an ON condition and an OFF condition, the condition of said latching circuit determining whether said switching means is operated in an ON state or an OFF state, and said control circuit being coupled to an auxiliary energy source for powering said electric latching circuit when there is an interruption in the power supplied by said main power source;

(e) said control circuit and said switching means being polarity insensitive and operating properly irrespective of whether the first and second main terminals of said switching means are coupled to said main power source and said load, respectively, or to said load and said main power source, respectively.

47. A load control system, comprising:

an electronic switching means operable in a conductive state and a non-conductive state, said switching means including first and second power leads connectable to a main power source and a load, respectively;

a control circuit for controlling the operation of said switching means as a function of control signals applied to said control circuit, said control circuit including memory means for storing the last state of said switching means while power is being supplied to said control circuit by said main power source and for returning said switching means to said stored state when power is returned to said control circuit after an interruption in power supplied by said main power source;

said memory means including an electronic latch, said latch having an ON state and an OFF state, said control circuit causing said electronic switching means to operate in said conductive state when said latch is in said ON state and causing said electronic switching means to operate in said non conductive state when said latch is in said OFF state; and said electronic latch having an energy storage source associated therewith for powering said electronic latch during an interruption in power supplied by said main power source.

48. A load control system, comprising:

a bidirectionally conductive electronic switching element having first and second main terminals and a control terminal, said electronic switching element being operable in a conductive and a non-conductive mode as a function of enabling signals applied to said control terminal; and a control circuit coupled directly to said control terminal and to said first and second main terminals and controlling the operation of said switching means in response to control signals applied to the control circuit, said control circuit being operable in an ON mode and an OFF mode, said control circuit causing said electronic switching element to be non-conductive whenever said control circuit is in said OFF mode and causing said electronic switching element to be conductive for at least 95% but less than 100% of each half cycle of an AC wave form applied across said first and second main terminals whenever said control circuit is in aid ON state and said electronic switching element is coupled between an AC source and a load;

said control circuit deriving all of its power from a voltage which appears across said main terminals of said switching means when said main terminals are connected to a load and to a main power source which is supplying power;

said control circuit including an electronic latching circuit which is operable in an ON state and an OFF state, said control circuit causing said switching element to be conductive for said at least 95% of said half cycle of said AC wave form when said latch is in said ON state and causing said switching element to be non-conductive when said latch is in said OFF state; and said load control system further comprising an energy source for powering said electronic latching circuit at times when there is an interruption in the power supplied by said main power source.

49. A load control system, comprising:

switching means having first and second main terminals and a control terminal; and a control circuit coupled to said control terminal and controlling the operation of said switching means in response to control signals applied to said control circuit, said control circuit being coupled directly to said first and second main terminals and deriving all of its power from the voltage which appears across said main terminals of said switching means when said switching means is coupled between a source and a load, said control circuit including a bistable latch operable in an ON or an OFF condition, the condition of said latch determining whether said switching means is operated in an ON or an OFF state, said control circuit and said switching means being polarity insensitive and operating properly irrespectively of whether the first and second main terminals of said switching means are coupled to said load and source, respectively, or to said source and load, respectively, said bistable latch being a magnetic latching relay having set and reset coils and a contact movable between said ON and OFF positions, the position of said contact determining the condition of said latch.

50. A load control system, comprising:

(a) switching means having first and second main terminals and a control terminal; and (b) a control circuit coupled to said control terminal and controlling the operation of said switching means in response to control signals applied to said control circuit, said control circuit being coupled to said first and second main terminals and deriving all of its power from the voltage which appears across said main terminals of said switching means when said switching means is coupled between a source and a load, said control circuit including:

(1) latching means having a contact movable between an ON and an OFF state, the position of said contact determining whether said switching means is operating in an ON or an OFF state;

(2) first and second capacitors which are arranged to be charged when said contact is in its first or second position, the charge stored on said capacitors being used to control said latching means as a function of said control signals; and (3) means for preventing said capacitors from being charged as long as said control signal is applied to said control circuit.

51. A load control system as claimed in claim 50, wherein said latching means is a bistable mechanical latch and the charge stored on said capacitors is used to change the position of said mechanical latch as a function of said control signals.

52. A load control system as claimed in claim 50, wherein said latching means is a magnetic latching relay having set and reset coils, said capacitors comprise set and reset capacitors associated with said set and reset coils, respectively, and the control circuit includes means for discharging a capacitor through its associated coil in response to the application of said control signal to said control circuit.

53. A load control system according to claim 52, further including means for charging a predetermined one of said capacitors whenever said contact is stuck in a position intermediate said ON and OFF positions.

54. A load control system according to claim 50, further including means for charging a predetermined one of said capacitors whenever said contact is stuck in a position intermediate said ON and OFF positions.

55. A load control system, comprising:
(a) switching means having first and second main terminals and a control terminal; and
(b) a control circuit coupled to said control terminal and controlling the operation of said switching means in response to control signals applied to said control circuit, said control circuit being coupled to said first and second main terminals and deriving all of its power from the voltage which appears across said main terminals of said switching means when said switching means is coupled between a source and a load, said control circuit including:
(1) latching means having a contact movable between an ON and an OFF state, the position of said contact determining whether said switching means is operating in an ON or an OFF state;
(2) first and second capacitors which are arranged to be charged when the contact is in its first or second position, the charge stored on said capacitors being used to control said latching means as a function of said control signals; and
(3) means for charging a predetermined one of said capacitors whenever said contact is stuck in a position intermediate said ON and OFF positions.

56. A load control system as claimed in claim 55, wherein said latching means is a bistable mechanical latch and the charge stored on said capacitors is used to change the position of said mechanical latch as a function of said control signals.

57. A load control system as claimed in claim 55, wherein said latching means is a magnetic latching relay having set and reset coils, said capacitors comprise set and reset capacitors associated with said set and reset coils, respectively, and said control circuit includes means for discharging a capacitor through its associated coil in response to the application of said control signal to said control circuit.

* * * * *